(12) United States Patent
Masudaya

(10) Patent No.: US 6,940,351 B2
(45) Date of Patent: Sep. 6, 2005

(54) AMPLIFYING CIRCUIT FOR TRANSMITTER CAPABLE OF REDUCING NOISE

(75) Inventor: Hideki Masudaya, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/672,743

(22) Filed: Sep. 26, 2003

(65) Prior Publication Data
US 2004/0066231 A1 Apr. 8, 2004

(30) Foreign Application Priority Data
Oct. 2, 2002 (JP) ........................................ 2002-289861

(51) Int. Cl.$^7$ ................................................. H03F 3/217
(52) U.S. Cl. ................................. 330/251; 330/207 A
(58) Field of Search ....................... 330/10, 251, 207 A, 330/311, 146

(56) References Cited

U.S. PATENT DOCUMENTS 3,239,771 A * 3/1966 Andreatta .................... 330/251
4,554,512 A * 11/1985 Aiello ........................... 330/10
6,577,194 B2 * 6/2003 Delano ......................... 330/251
6,605,991 B2 * 8/2003 Midya et al. ................. 330/10

FOREIGN PATENT DOCUMENTS

JP  07-254824  10/1995

* cited by examiner

Primary Examiner—Henry Choe
(74) Attorney, Agent, or Firm—Brinks Hofer Gilson & Lione

(57) ABSTRACT

In an amplifying circuit for a transmitter including a first switching device having one end thereof connected to a power supply, a second switching device having one end thereof connected to another end of the first switching device and another end thereof grounded and an antenna connected to a junction point of the first switching device and the second switching device, wherein the first switching device and the second switching device 12 are alternately driven by a driver, the driver and a control electrode of the first switching device as well as the driver and a control electrode of the second switching device are connected through a common mode filter.

4 Claims, 6 Drawing Sheets

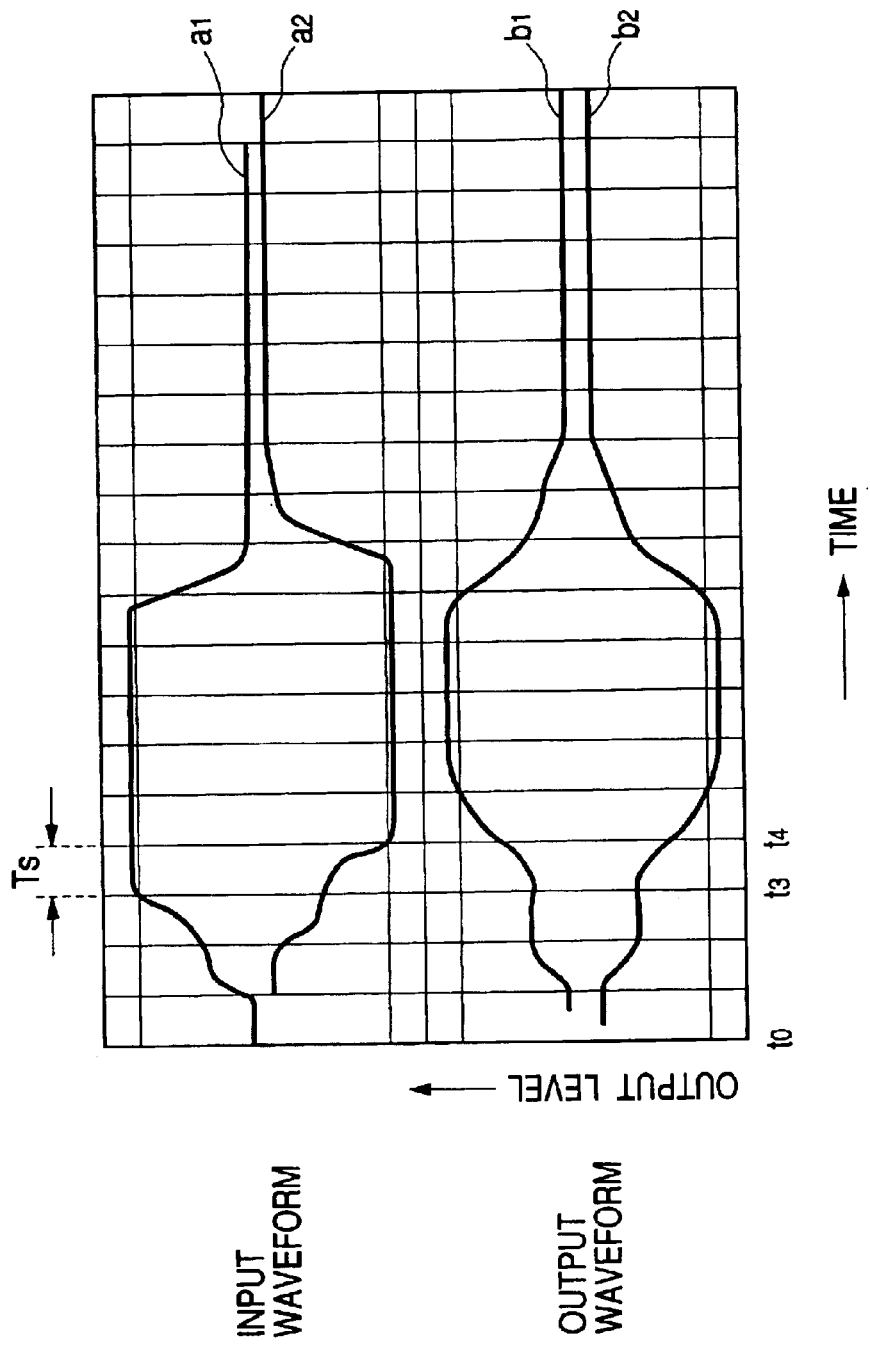

AMPLIFYING CIRCUIT FOR TRANSMITTER CAPABLE OF REDUCING NOISE

BACKGROUND OF THE INVENTION

1. Field of the Invention

The present invention relates to an amplifying circuit for a transmitter, and more particularly to an amplifying circuit for a transmitter capable of reducing a noise.

2. Description of the Related Art

FIG. 5 is a view for explaining a conventional amplifying circuit for a transmitter, wherein FIG. 5A is a view for schematically explaining the amplifying circuit for a transmitter. In the figure, numeral 1 denotes an amplifier made up of a transistor connected by a push-pull circuit, numeral 2 donates an antenna that is a load of the amplifier and numeral 3 donates a driving circuit (driver) for driving the amplifier 1 that is provided with inversion circuits 31, 32 and 33 for inverting a driving signal supplied from a CPU 4 and supplying the resultant signal to the amplifier 1. Numeral 4 denotes the CPU for supplying a driving signal 41 to the driver 3. The CPU 4 modulates a carrier wave (carrier) with, for example, a control signal for locking a door of an automobile or a control signal for unlocking the same to thereby produce a PWM signal as a driving signal. The produced PWM signal is amplified by the amplifier 1 and then emitted to a subjective automobile.

FIG. 5B is a view showing an output waveform (view at the left side) from the driver 3 and a spectral distribution (view at the right side) of the driver output. As shown in the figure, the output from the driver has a PWM waveform having a predetermined cycle Tc that is modulated by, for example, a signal for unlocking the door.

FIG. 5C is a view showing an output waveform (view at the left side) from the amplifier 1 and a spectral distribution (view at the right side) of this output waveform. As shown in the figure, a rectangular wave is outputted in which a steepness of the waveform is reduced due to the intervention of the amplifier 1. Further, the spectral distribution at this time has a distribution in which a harmonic content is reduced. Specifically, it is understood that the harmonic content ($2fc$, $3fc$, ...) of the carrier frequency fc corresponding to the above-mentioned predetermined cycle Tc is reduced.

FIG. 6 is a view for explaining in detail an amplifying circuit containing the amplifier 1. In this figure, numerals 11, 12, 13 and 14 denote switching devices each made up of an FET (Field Effect Transistor) or the like, these switching devices constituting the amplifier 1. The first switching device 11 and the second switching device 12 are connected in series between a power supply 10 and a ground E, while the third switching device 13 and the fourth switching device 14 are connected in series between the power supply 10 and the ground E. Further, the antenna 2 is connected between a junction point of the first switching device 11 and the second switching device 12 and a junction point of the third switching device 13 and the fourth switching device 14. Numerals 31, 32 and 33 each denotes an inversion circuit making up the driving circuit.

Numeral 41 denotes a driving signal of the first switching device 11, this signal being supplied to a control electrode of the first switching device 11. Numerals 42, 43 and 44 each denote a driving signal of the second switching device 12, third switching device 13 and the fourth switching device 14 respectively, each signal being supplied to a control electrode of each of the second switching device 12, the third switching device 13 and the fourth switching device 14.

As described above, the CPU 4 modulates the carrier wave (carrier) with, for example, the control signal for locking the door of an automobile or the control signal for unlocking the same to thereby produce the PWM signal as the driving signal.

At first, when the driving signal 41 produced by the CPU 4 is in H-level, this H-level driving signal 41 energizes the first switching device 11 to turn it on. At this time, the driving signal 41 is inverted by the inversion circuit 32 to become the L-level driving signal 42 that then energizes the second switching device 12 to turn it off. When the driving signal 41 produced by the CPU 4 is in L-level, this L-level driving signal energizes the first switching device 11 to turn it off. At this time, the driving signal 41 is inverted by the inversion circuit 32 to become the H-level driving signal that then energizes the second switching device 12 to turn it on.

On the other hand, the driving signal 41 produced by the CPU 4 is supplied to the third switching device 13 through the inversion circuit 31, and further, to the fourth switching device 14 through the inversion circuit 33.

In this case, when the driving signal 43 that inverts the driving signal 41 produced by the CPU 4 is in L-level, this L-level driving signal 43 energizes the third switching device 13 to turn it off. At this time, the driving signal 43 is inverted by the inversion circuit 33 to become an H-level driving signal 44. This H-level signal energizes the fourth switching device 14 to turn it on. When the driving signal 43 that inverts the driving signal 41 produced by the CPU 4 is in H-level, this H-level driving signal 43 energizes the third switching device 13 to turn it on. At this time, the driving signal 43 is inverted by the inversion circuit 33 to become the L-level driving signal 44 that then energizes the fourth switching device 14 to turn it off.

Specifically, when the driving signal 41 produced by the CPU 4 is in H-level, the first switching device 11 and the fourth switching device 14 are turned on, while the second switching device 12 and the third switching device 13 are turned off. When the driving signal 41 produced by the CPU 4 is in L-level, the first switching device 11 and the fourth switching device 14 are turned off, while the second switching device 12 and the third switching device 13 are turned on.

In the case where the driving signal 41 is transmitted through the inversion circuits 31, 32 and 33, a delay occurs in the signal transmission. When the delay occurs in the signal transmission, the first switching device 11 is turned on before the second switching device 12 is turned off, for example, meaning that the first switching device 11 and the second switching device 12 are simultaneously energized. Similarly, in the case where the third switching device 13 is turned on before the fourth switching device 14 is turned off, the third switching device 13 and the fourth switching device 14 are simultaneously energized.

When the first switching device 11 and the second switching device 12 or the third switching device 13 and the fourth switching device 14 are simultaneously energized, feedthrough current flows through these switching devices. This feedthrough current is peak current having a great peak value and a steep rising, by which the voltage of the power supply 10 greatly fluctuates. This peak current or the fluctuation in the power supply voltage is transmitted to the antenna 2 to thereby be emitted to the outside as noise.

FIG. 7 is a view for explaining a conventional method for controlling a noise. In the figure, numerals 15 and 16 denote resistances for controlling the feedthrough current, wherein the resistance 15 is connected between the first switching device 11 and the power supply 10, while the resistance 16 is connected between the third switching device 13 and the power supply 10. The resistances for controlling the feedthrough current control the peak value or the steepness at the rising of the feedthrough current, so that the noise caused by the peak value or the steepness at the rising of the feedthrough current can be controlled.

When, for example, the first switching device 11 and the second switching device 12 are simultaneously energized as described above in the amplifier made up of the push-pull-connected transistor, not only the noise occurs but also the efficiency of the amplifier 1 reduces and further, there may be the case where the switching devices are destroyed due to the above-mentioned feedthrough current. Further, in the case where the resistances for controlling the feedthrough current for controlling the feedthrough current are used as described above, a countermeasure is required for radiating heat from these resistances.

SUMMARY OF THE INVENTION

The present invention is accomplished in view of these problems, and aims to provide an amplifying circuit for a transmitter having reduced noise emission and high efficiency.

The present invention applies the following techniques for solving the aforesaid problems.

In an amplifying circuit for a transmitter including a first switching device having one end thereof connected to a power supply, a second switching device having one end thereof connected to another end of the first switching device and another end thereof grounded and a load connected to a junction point of the first switching device and the second switching device, in which the first switching device and the second switching device are alternately driven by a driving circuit, the driving circuit and a control electrode of the first switching device as well as the driving circuit and a control electrode of the second switching device are connected through a common mode filter.

As described above, the driving circuit and the control electrode of the switching device are connected through the common mode filter for controlling the occurrence of feedthrough current, thereby being capable of controlling the fluctuation in a power supply voltage caused with the occurrence of the feedthrough current, transition of noise to an antenna caused with the fluctuation in the power supply voltage and emission of noise from the antenna. Further, controlling the feedthrough current can attain a long-life of the switching device, thereby being capable of further reducing power consumption.

In an amplifying circuit for a transmitter including a first switching device having one end connected thereof to a power supply, a second switching device having one end thereof connected to another end of the first switching device and another end thereof grounded, a third switching device having one end thereof connected to the power supply, a fourth switching device having one end thereof connected to another end of the third switching device and another end thereof grounded, and a load connected between a junction point of the first switching device and the second switching device and a junction point of the third switching device and the fourth switching device, in which the first switching device and the second switching device as well as the third switching device and the fourth switching device are alternately driven by a driving circuit, the driving circuit and a control electrode of the first switching device as well as the driving circuit and a control electrode of the second switching device, and the driving circuit and a control electrode of the third switching device as well as the driving circuit and a control electrode of the fourth switching device are respectively connected through a common mode filter.

As described above, the driving circuit and the control electrode of the switching device are connected through the common mode filter for controlling the occurrence of feedthrough current, thereby being capable of controlling the fluctuation in a power supply voltage caused with the occurrence of the feedthrough current, transition of noise to an antenna caused with the fluctuation in the power supply voltage and emission of noise from the antenna. Further, controlling the feedthrough current can attain a long-life of the switching device, thereby being capable of further reducing power consumption.

Further, the common mode filter is formed by two solenoid coils concentrically wound around the same core in the same direction. Since two solenoid coils n1 and n2 are electromagnetically coupled, the same induced voltage is produced if the turn of each solenoid coil is the same. Therefore, an output with mutually little delay can be obtained at the output side of the respective solenoid coils n1 and n2. Accordingly, supplying this output to the control electrode of each of the first switching device 11 and the second switching device 12 can provide an output wherein the feedthrough current is controlled.

BRIEF DESCRIPTION OF DRAWINGS

FIG. 4 is a view for explaining an operation of the filter;

DESCRIPTION OF THE PREFERRED EMBODIMENT

Figure 1:
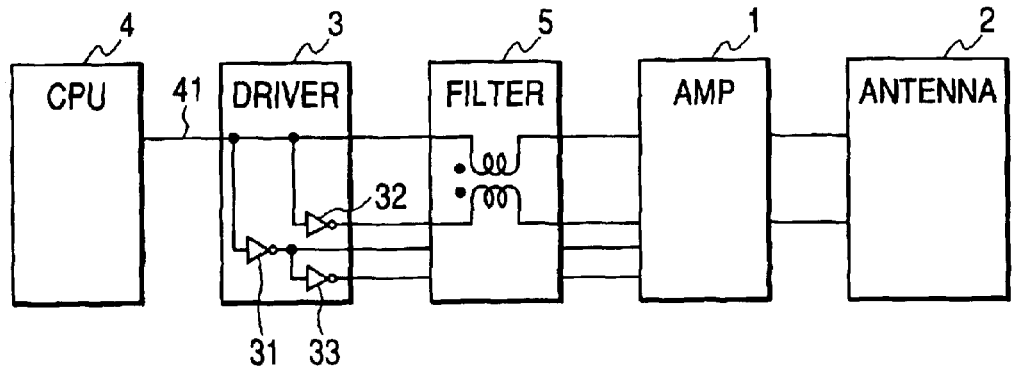
FIG. 1 is a view for explaining an amplifying circuit for a transmitter according to an embodiment of the present invention.
Figure 5A:
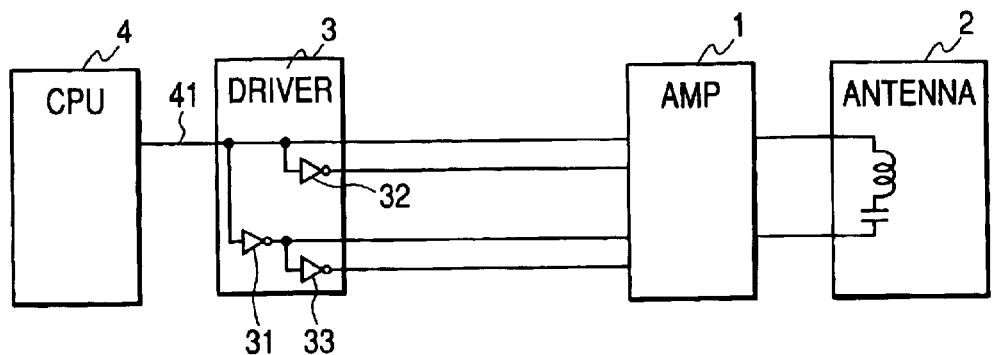
FIGS. 5A to 5C are views for explaining a conventional amplifying circuit for a transmitter.
Figure 5B:
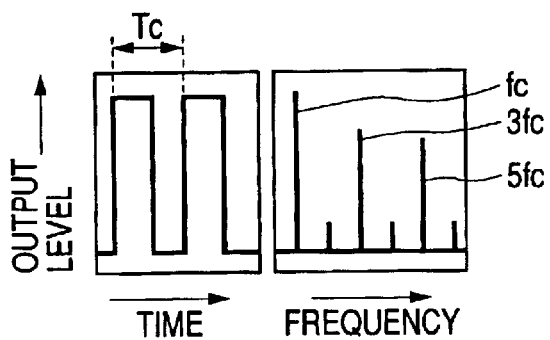
Figure 5C:
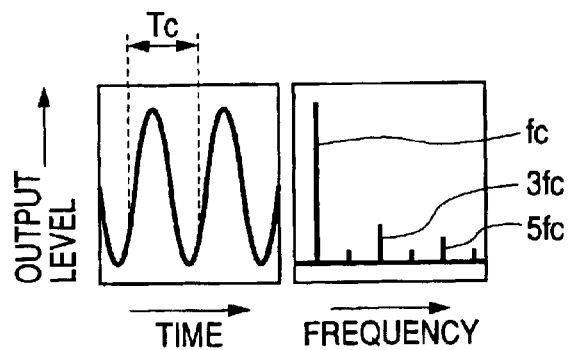

An embodiment of the present invention will be explained hereinbelow with reference to the attached drawings. FIG. 1 is a view for explaining an amplifying circuit for a transmitter according to the embodiment of the present invention. In the figure, numeral 5 denotes a filter such as a common mode filter. The common mode filter can be made of two solenoid coils concentrically wound around the same core in the same direction. It is to be noted that identical parts shown in FIG. 5 are given by identical numerals for omitting the explanation thereof.

Figure 2A:
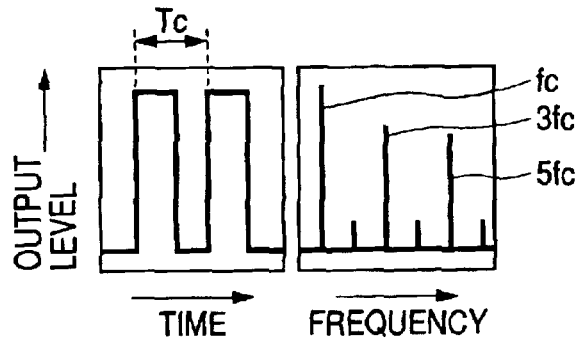
FIG. 2A is a view for explaining an output waveform from a driver in the amplifying circuit for a transmitter.

FIG. 2 is a view for explaining an output waveform from each section of the amplifying circuit for a transmitter, wherein FIG. 2A is a view showing an output waveform (view at the left side) from a driver 3 and a spectral distribution (view at the right side) of the driver output. As shown in the figure, the output from the driver 3 has a PWM waveform having a predetermined cycle Tc that is modulated by, for example, a signal for unlocking the door.

Figure 2B:
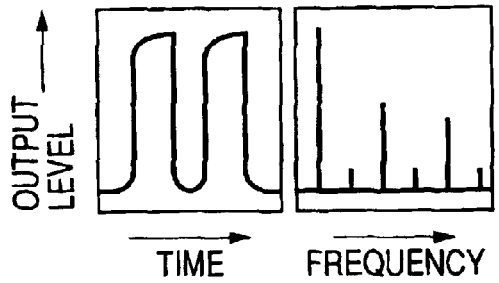
FIG. 2B is a view for explaining an output waveform from a filter in the amplifying circuit for a transmitter.

FIG. 2B is a view showing an output waveform (view at the left side) from a filter 5 and a spectral distribution (view at the right side) of this output waveform. As shown in the figure, a rectangular wave in which a steepness of the waveform is reduced is outputted. Further, as shown in the spectral distribution (view at the right side), it is understood that a harmonic content ($2fc$, $3fc$, ... ) is reduced.

Figure 2C:
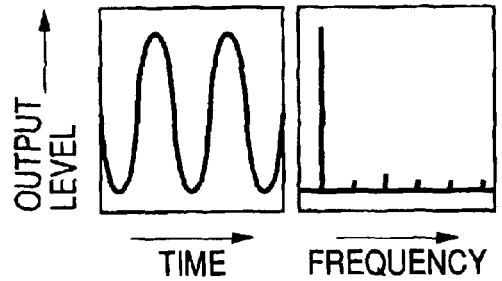
FIG. 2C is a view for explaining an output waveform from an amplifier in the amplifying circuit for a transmitter.

FIG. 2C is a view showing an output waveform (view at the left side) from an amplifier 1 and a spectral distribution (view at the right side) of this output waveform. As shown in the figure, a rectangular wave is outputted in which a steepness of the waveform is further reduced due to the intervention of the amplifier 1 compared to the output waveform from the filter 5. Further, as shown in the spectral distribution (view at the right side), it is understood that a harmonic content ($2fc$, $3fc$, ... ) is further reduced compared to the spectral distribution of the output waveform from the filter 5.

Further as shown in FIG. 2C, it is understood that the harmonic content in this embodiment is greatly reduced with respect to the harmonic content explained in FIG. 5.

Figure 3:
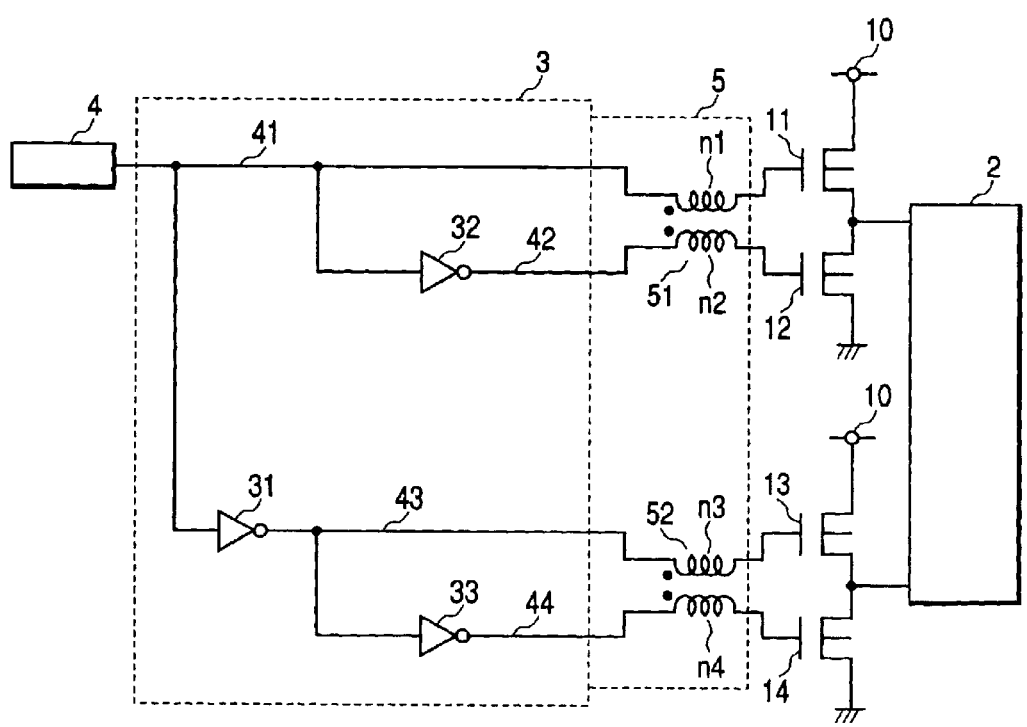
FIG. 3 is a view for explaining details of an amplifying circuit for a transmitter according to an embodiment of the present invention.

FIG. 3 is a view for explaining details of the amplifying circuit for a transmitter according to this embodiment. In the figure, numeral 5 denotes the common mode filter that is made of two solenoid coils n1 and n2 concentrically wound around the same core in the same direction.

An output terminal of the driving signal 41 produced by the CPU 4 and the control electrode of the first switching device 11 are connected with a solenoid coil n1 of a common mode filter 51, while an output terminal of the inversion circuit 32 and the control electrode of the switching device 12 are connected with a solenoid coil n2 of the common mode filter 51.

Figure 6:
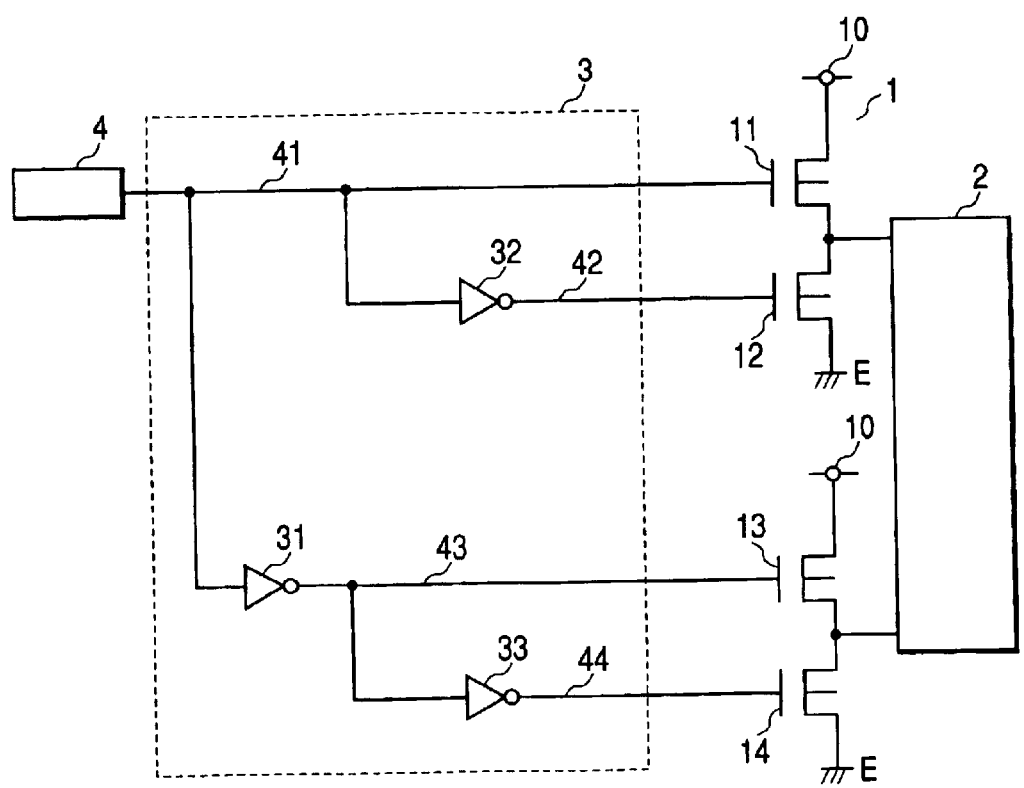
FIG. 6 is a view for explaining details of the amplifying circuit.
Figure 7:
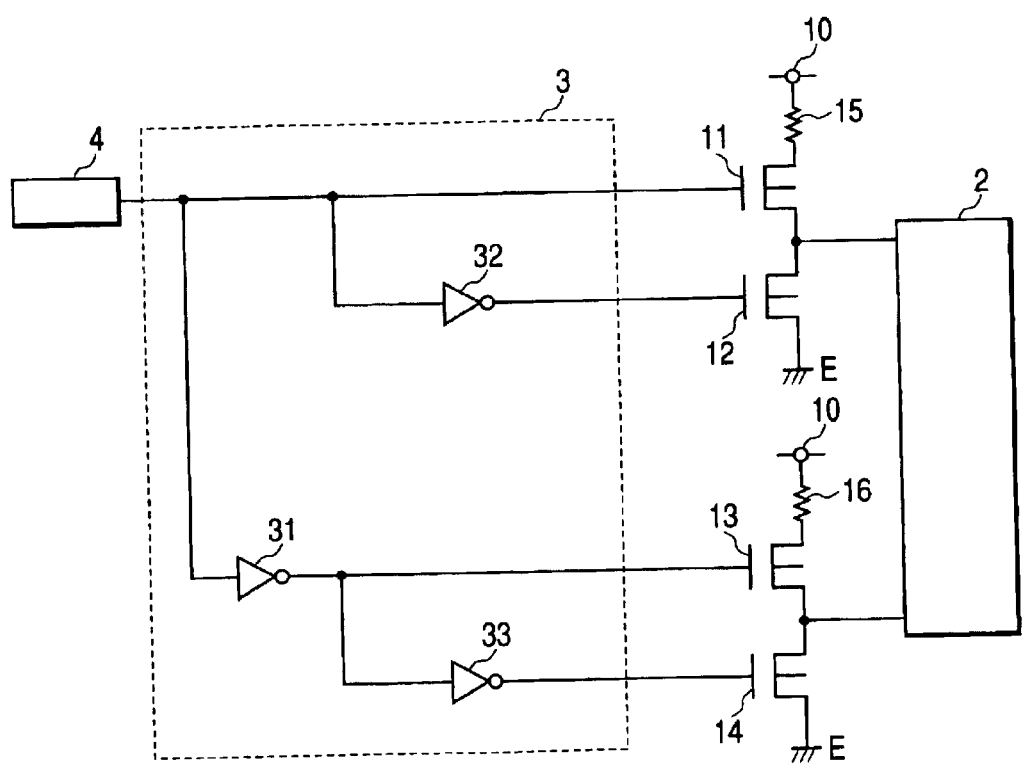
FIG. 7 is a view for explaining a conventional method for controlling noise.

Similarly, an inversion output terminal of the inversion circuit 31 that inverts the driving signal 41 produced by the CPU 4 and the control electrode of the third switching device 13 are connected with a solenoid coil n3 of a common mode filter 52, while an inversion output terminal of the inversion circuit 33 that inverts again the output from the inversion circuit 31 and the control electrode of the fourth switching device 14 are connected with a solenoid coil n4 of the common mode filter 52. It is to be noted that identical parts shown in FIG. 6 are given by identical numerals for omitting the explanation thereof.

FIG. 4 is a view for explaining an operation of the common mode filter 5, showing an input waveform and an output waveform. In the figure, symbol a1 denotes an input waveform to the solenoid coil n1 making up the common mode filter 51, symbol a2 denotes an input waveform to the solenoid coil n2, symbol b1 denotes an output waveform from the solenoid coil n1 and symbol b2 denotes an output waveform from the solenoid coil n2.

The driving signal 41 produced by the CPU 4 is directly applied to the input terminal of the solenoid coil n1. Further, the driving signal 42 that inverts the driving signal 41 is applied to the input terminal of the solenoid coil n2 via the inversion circuit 32. Therefore, with respect to the input waveform a1 applied to the input terminal of the solenoid coil n1, the delay occurs due to the inversion circuit 32 in the waveform a2 that is applied to the input terminal of the solenoid coil n2 and is the inversion of the input waveform a1.

In the case where the input waveforms a1 and a2 are applied to the control electrodes of the first switching device 11 and the second switching device 12, for example, the first switching device 11 is turned on during a time t3 to a time t4, while the second switching device 12 is not completely turned off. Therefore, the first switching device 11 and the second switching device 12 are simultaneously energized during this period as described above, so that feedthrough current flows.

The common mode filter 51 is made of the two solenoid coils n1 and n2 concentrically wound around the same core in the same direction as described above. Specifically, since the two solenoid coils n1 and n2 are electromagnetically coupled, the same induced voltage is produced if the turn of each solenoid coil is the same. Therefore, an output with mutually little delay can be obtained at the output side of the respective solenoid coils n1 and n2. Accordingly, supplying this output to the control electrode of each of the first switching device 11 and the second switching device 12 can provide an output wherein the feedthrough current is controlled. Although the above explanation is made about the common mode filter 51, the same operation may be applied to the common mode filter 52.

As described above, according to the present invention, the occurrence of feedthrough current is controlled, thereby being capable of controlling the fluctuation in a power supply voltage caused with the occurrence of the feedthrough current, transition of noise to an antenna caused with the fluctuation in the power supply voltage and emission of noise from the antenna. Further, controlling the feedthrough current can attain a long-life of the switching device, thereby being capable of further reducing power consumption.

As explained above, the present invention can provide an amplifying circuit for a transmitter having reduced noise emission and high efficiency.

What is claimed is:

1. An amplifying circuit for a transmitter comprising:
a first switching device having one end thereof connected to a power supply;
a second switching device having one end thereof connected to another end of the first switching device and another end thereof grounded; and
a load connected to a junction point of the first switching device and the second switching device, in which the first switching device and the second switching device are driven by a driving circuit,
wherein the driving circuit includes an inverting circuit connected to a control electrode of the second switching device, and an input signal inverted with respect to an input signal of the first switching device is applied to the control electrode of the second switching device, and
wherein the driving circuit and a control electrode of the first switching device as well as the inverting circuit of the driving circuit and the control electrode of the second switching device are connected through a common mode filter.

2. The amplifying circuit for a transmitter according to claim 1, wherein the common mode filter is constituted of two solenoid coils concentrically wound around the same core in the same direction.

3. An amplifying circuit for a transmitter comprising:
a first switching device having one end thereof connected to a power supply;
a second switching device having one end thereof connected to another end of the first switching device and another end thereof grounded;

a third switching device having one end thereof connected to the power supply;

a fourth switching device having one end thereof connected to another end of the third switching device and another end thereof grounded; and a load connected between a junction point of the first switching device and the second switching device and a junction point of the third switching device and the fourth switching device, in which the first switching device and the second switching device as well as the third switching device and the fourth switching device are driven by a driving circuit, wherein the driving circuit includes a first inverting circuit connected to a control electrode of the second switching device, and an input signal inverted with respect to an input signal of the first switching device is applied to the control electrode of the second switching device, wherein the driving circuit includes a second inverting circuit connected to the third and fourth switching devices, a third inverting circuit connected to a control electrode of the fourth switching device, and an input signal inverted with respect to an input signal of the first switching device is applied to a control electrode of the third switching device;

wherein an input signal inverted with respect to an input signal of the third switching device is applied to the control electrode of the fourth switching device; and wherein the driving circuit and a control electrode of the first switching device as well as the first inverting circuit of the driving circuit and the control electrode of the second switching device, and the second inverting circuit of the driving circuit and the control electrode of the third switching device as well as the third inverting circuit of the driving circuit and the control electrode of the fourth switching device are respectively connected through a common mode filter.

4. The amplifying circuit for a transmitter according to claim 3, wherein the common mode filter is constituted of two solenoid coils concentrically wound around the same core in the same direction.

* * * * *